United States Patent
Gharavi et al.

(10) Patent No.: US 9,948,260 B1
(45) Date of Patent: *Apr. 17, 2018

(54) WIRELESS RECEIVER WITH REDUCED NUMBER OF PHASE SHIFTERS

(71) Applicant: Movandi Corporation, Newport Beach, CA (US)

(72) Inventors: Sam Gharavi, Irvine, CA (US); Ahmadreza Rofougaran, Newport Coast, CA (US); Farid Shirinfar, Granada Hills, CA (US); Seunghwan Yoon, Irvine, CA (US); Alfred Grau Besoli, Irvine, CA (US); Michael Boers, South Turramurra (AU); Maryam Rofougaran, Rancho Palos Verdes, CA (US)

(73) Assignee: Movandi Corporation, Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/660,077

(22) Filed: Jul. 26, 2017

Related U.S. Application Data (63) Continuation of application No. 15/292,421, filed on Oct. 13, 2016.

(51) Int. Cl.
  H04B 1/06     (2006.01)
  H03G 3/30     (2006.01)
  H04B 1/16     (2006.01)

(52) U.S. Cl.
  CPC ............ *H03G 3/3036* (2013.01); *H04B 1/16* (2013.01)

(58) Field of Classification Search
  CPC ............ H04B 1/06; H04B 1/16; H01G 4/005
  See application file for complete search history.

(56) References Cited

U.S. PATENT DOCUMENTS

| | | | | |
|---|---|---|---|---|
| 5,917,375 A | * | 6/1999 | Lisco | H03F 1/3229 330/149 |
| 6,198,449 B1 | * | 3/2001 | Muhlhauser | H01Q 3/2658 343/753 |
| 7,130,576 B1 | * | 10/2006 | Gurantz | H04H 40/90 455/3.01 |

* cited by examiner

*Primary Examiner* — Tuan Pham
(74) *Attorney, Agent, or Firm* — Farjami & Farjami LLP (57) ABSTRACT

A wireless receiver includes an antenna receiving a right-handed circularly polarized (RHCP) signal and a left-handed circularly polarized (LHCP) signal, a first amplifier and a second amplifier coupled to the antenna, an intermediate summer coupled to the first and second amplifiers and providing a first intermediate signal, an intermediate subtractor coupled to the first and second amplifiers and providing a second intermediate signal. The wireless receiver also includes a V-signal summer providing a V-component output based on a sum of the first intermediate signal and the second intermediate signal, and an H-signal subtractor providing an H-component output based on a difference between the first intermediate signal and the second intermediate signal. The wireless receiver is configured to provide the V-component output and the H-component output without using a phase shifter.

20 Claims, 5 Drawing Sheets

WIRELESS RECEIVER WITH REDUCED NUMBER OF PHASE SHIFTERS

The present application is a continuation application of U.S. patent application Ser. No. 15/292,421, titled "Wireless Receiver Having Improved Phase Shifting Schemes with Reduced Number of Phase Shifters," filed on Oct. 13, 2016. The above-identified application is hereby incorporated fully by reference into the present application.

RELATED APPLICATION(S)

The present application is related to U.S. patent application Ser. No. 15/225,071, filed on Aug. 1, 2016, and titled "Wireless Receiver with Axial Ratio and Cross-Polarization Calibration," and U.S. patent application Ser. No. 15/225,523, filed on Aug. 1, 2016, and titled "Wireless Receiver with Tracking Using Location, Heading, and Motion Sensors and Adaptive Power Detection," and U.S. patent application Ser. No. 15/226,785, filed on Aug. 2, 2016, and titled "Large Scale Integration and Control of Antennas with Master Chip and Front End Chips on a Single Antenna Panel," and U.S. patent application Ser. No. 15/255,656, filed on Sep. 2, 2016, and titled "Novel Antenna Arrangements and Routing Configurations in Large Scale Integration of Antennas with Front End Chips in a Wireless Receiver," and U.S. patent application Ser. No. 15/256,038 filed on Sep. 2, 2016, and titled "Transceiver Using Novel Phased Array Antenna Panel for Concurrently Transmitting and Receiving Wireless Signals," and U.S. patent application Ser. No. 15/256,222 filed on Sep. 2, 2016, and titled "Wireless Transceiver Having Receive Antennas and Transmit Antennas with Orthogonal Polarizations in a Phased Array Antenna Panel," and U.S. patent application Ser. No. 15/278,970 filed on Sep. 28, 2016, and titled "Low-Cost and Low-Loss Phased Array Antenna Panel," and U.S. patent application Ser. No. 15/279,171 filed on Sep. 28, 2016, and titled "Phased Array Antenna Panel Having Cavities with RF Shields for Antenna Probes," and U.S. patent application Ser. No. 15/279,219 filed on Sep. 28, 2016, and titled "Phased Array Antenna Panel Having Quad Split Cavities Dedicated to Vertical-Polarization and Horizontal-Polarization Antenna Probes." The disclosures of all of these related applications are hereby incorporated fully by reference into the present application.

BACKGROUND

Wireless communications systems, such as satellite communications systems, can transmit and receive data using polarized signals, such as circularly polarized signals. In a conventional wireless receiver, phase shifters such as 90-degree phase shifters are routinely utilized to provide a controlled phase shift to wireless signals for signal processing. However, phase shifters are typically bulky, and can thus undesirably occupy valuable space in the wireless receiver. Phase shifters can also introduce insertion loss and reduce linearity in the wireless receiver.

Thus, there is a need in the art for a wireless receiver having improved phase shifting schemes that can reduce the number of phase shifters.

SUMMARY

The present disclosure is directed to a wireless receiver having improved phase shifting schemes with reduced number of phase shifters, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
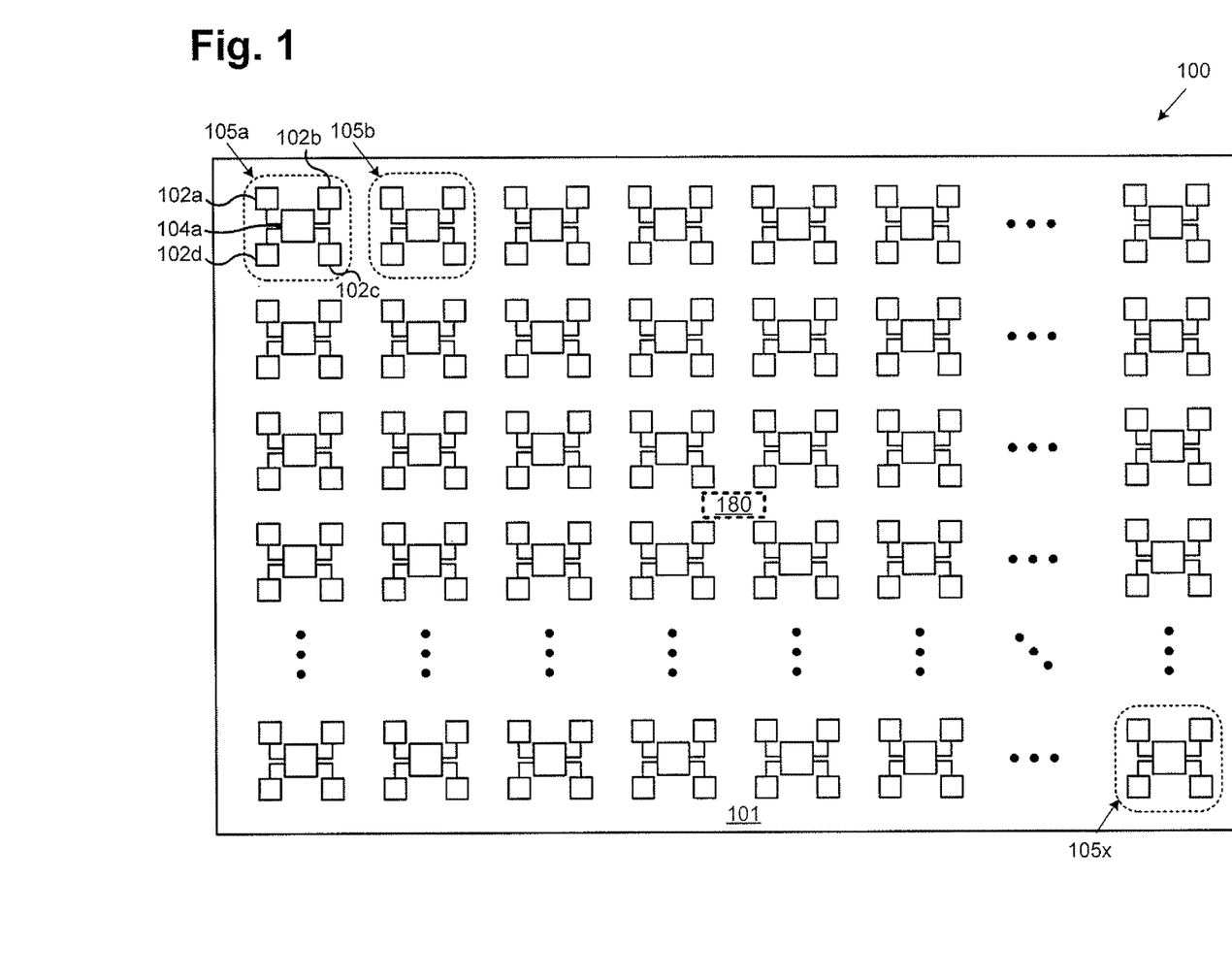
FIG. 1 illustrates a top plan view of a portion of an exemplary wireless receiver according to one implementation of the present application.

Referring to FIG. 1, FIG. 1 illustrates a top plan view of a portion of an exemplary wireless receiver according to one implementation of the present application. As illustrated in FIG. 1, wireless receiver 100 includes phased array antenna panel 101 having a plurality of front end units such as front end units 105*a*, 105*b* and 105*x* (hereinafter collectively referred to as "front end units 105"), and master chip 180. Each of front end units 105 includes an RF front end chip coupled to a group of antennas. In the present implementation, each front end unit is coupled to a group of four antennas. For example, in front end unit 105*a*, RF front end chip 104*a* is coupled to antennas 102*a*, 102*b*, 102*c* and 102*d* through antenna feed lines. In one implementation, each antenna feed line includes a pair of lines such that one line in the pair would carry a horizontally-polarized signal while the other line in the pair would carry a vertically-polarized signal. However, for ease of illustration, each pair is shown as a single feed line, even for implementations that a pair of lines are represented by each feed line.

In one implementation, the antennas in phased array antenna panel 101 may be configured to receive signals from one or more wireless transmitters, such as commercial geostationary communication satellites or low earth orbit satellites having a very large bandwidth in the 10 GHz to 20 GHz frequency range and a very high data rate. In another implementation, the antennas on phased array antenna panel 101 may be configured to receive signals in the 60 GHz frequency range, sometimes referred to as "60 GHz communications," which involve transmission and reception of millimeter wave signals. Among the applications for 60 GHz communications are wireless personal area networks, wireless high-definition television signal and Point-to-Point links. In yet other implementations the antennas on phased array antenna panel 101 may be configured to receive signals in the 26 GHz to 30 GHz range that can be suitable for use in 5G technology (5th generation mobile networks or 5th generation wireless systems).

In one implementation, for a wireless transmitter transmitting signals at 10 GHz (i.e., λ=30 mm), each antenna in phased array antenna panel 101 needs an area of at least a quarter wavelength (e.g., λ/4=7.5 mm) by a quarter wavelength (e.g., λ/4=7.5 mm) to receive the transmitted signals. As illustrated in FIG. 1, the antennas, such as antennas 102a, 102b, 102c and 102d, in phased array antenna panel 101 may each have a substantially square shape having dimensions of 7.5 mm by 7.5 mm, for example. In one implementation, each adjacent pair of antennas may be separated by a distance of a multiple integer of the quarter wavelength (i.e., n*λ/4), such as 7.5 mm, 15 mm, 22.5 mm, and etc. In that implementation, each of the antenna feed lines may each have a length of a multiple integer of the half wavelength (i.e., n*λ/2), such as 15 mm, 30 mm, 45 mm, and etc.

In one implementation, wireless receiver 100 may include 2000 antennas and 500 RF front end chips in phased array antenna panel 101, where each of the RF front end chips is coupled to a group of four antennas. In another implementation, wireless receiver 100 may include 3000 antennas and 500 RF front end chips in phased array antenna panel 101, where each of the RF front end chips is coupled to a group of six antennas. In yet another implementation, wireless receiver 100 may include 2000 antennas and 250 RF front end chips in phased array antenna panel 101, where each of the RF front end chips is coupled to a group of eight antennas. It should be noted that implementations of the present application are not limited by the numbers of the antennas and the RF front end chips mentioned above.

In the present implementation, phased array antenna panel 101 is a flat panel array employing various types of antennas, such as patch antennas, or alternatively antenna probes in cavities (also referred to as "cavity antennas" in the present application). However, the present application is not limited to a certain type of antenna. Phased array antenna panel 101 is coupled to associated active circuits to form one or more beams for reception and/or transmission. In one implementation, the beams are formed fully electronically by means of phase and amplitude control circuits associated with the antennas. Thus, phased array antenna panel 101 can provide for beamforming without the use of any mechanical parts.

In the present implementation, master chip 180 may be formed in a layer of a substrate that is different than that in which phased array antenna panel 101 resides. Master chip 180 is coupled to front end units 105 in phased array antenna panel 101 using conductive trances routed through a routing layer, for example. In the present implementation, master chip 180 is configured to receive signals from the RF front end chips in front end units 105, and provide phase and amplitude control information to the RF front end chips in front end units 105. For example, master chip 180 may drive in parallel a number of N-bit buses (not explicitly shown in FIG. 1), such as 10-bit buses, where each N-bit bus is coupled to a respective segment of the front end units. In one implementation, front end units 105 and master chip 180 are integrated on a single substrate, such as a printed circuit board.

Figure 2A:
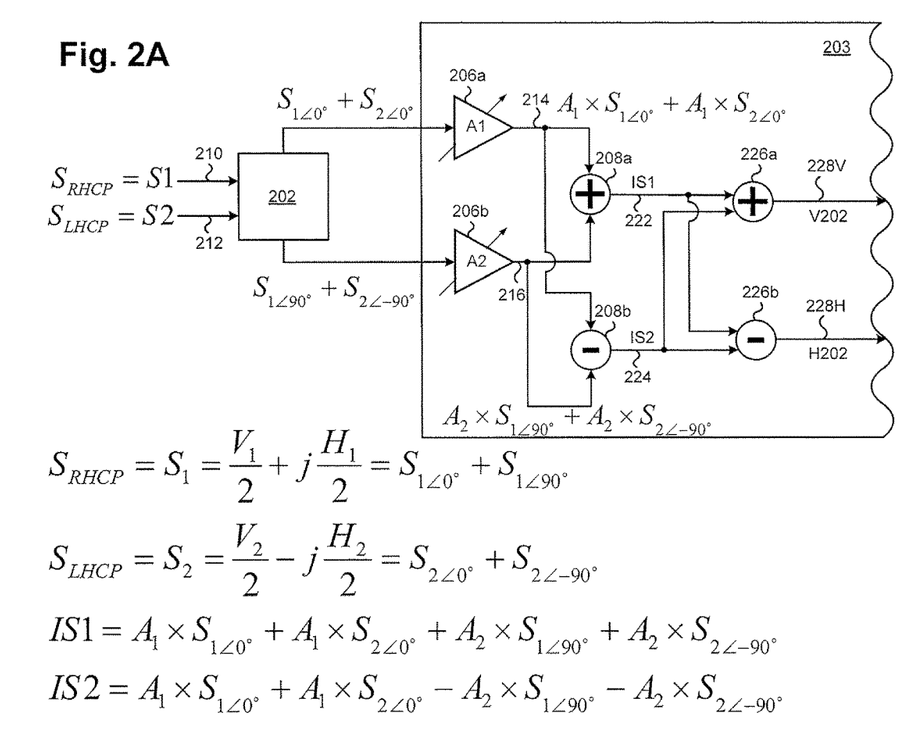
FIG. 2A illustrates a functional circuit diagram of a portion of an exemplary wireless receiver according to one implementation of the present application.

Referring to FIG. 2A, FIG. 2A illustrates a functional circuit diagram of a portion of an exemplary wireless receiver according to one implementation of the present application. As illustrated in FIG. 2A, antenna 202 is coupled to H-component/V-component generation block 203. In one implementation, antenna 202 in FIG. 2A may correspond to any of the antennas, such as antennas 102a, 102b, 102c and 102d, in wireless receiver 100 in FIG. 1. In one implementation, H-component/V-component generation block 203 may be part of an RF front end chip, such as RF front end chip 104a in FIG. 1. In another implementation, H-component/V-component generation block 203 may be part of a master chip, such as master chip 180 in FIG. 1. In yet another implementation, H-component/V-component generation block 203 may be integrated in any appropriate portion of the active circuits in a wireless receiver, such as wireless receiver 100 in FIG. 1.

In one implementation, antenna 202 may be configured to receive signals from one or more wireless transmitters, such as commercial geostationary communication satellites or low earth orbit satellites having a very large bandwidth in the 10 GHz to 20 GHz frequency range and a very high data rate. In another implementation, antenna 202 may be configured to receive signals in the 60 GHz frequency range, sometimes referred to as "60 GHz communications," which involve transmission and reception of millimeter wave signals.

As illustrated in FIG. 2A, antenna 202 is configured to receive wireless signals, such as right-handed circularly polarized (RHCP) signal 210 (i.e., $S_{RHCP}=S_1$) and left-handed circularly polarized (LHCP) signal 212 (i.e., $S_{LHCP}=S_2$) concurrently, for example. In one implementation, antenna 202 may be a patch antenna, or alternatively a cavity antenna, having a vertical-polarization probe and a horizontal-polarization probe (not explicitly shown in FIG. 2A) extended over the cavity. However, the present application is not limited to a certain type of antenna, and various antenna designs, shapes, or configurations can be used. It should be understood that circularly polarized signals received by antenna 202 can each be separated into a horizontal (H) component and a vertical (V) component. For example, RHCP signal 210 can be expressed as, $$S_{RHCP} = S_1 = \frac{V_1}{2} + j\frac{H_1}{2} = S_{1\angle 0°} + S_{1\angle 90°}. \qquad \text{Equation (1)}$$

Similarly, LHCP signal 212 can be expressed as, $$S_{LHCP} = S_2 = \frac{V_2}{2} - j\frac{H_2}{2} = S_{2\angle 0°} + S_{2\angle -90°}. \qquad \text{Equation (2)}$$

In the present implementation, antenna 202 receives RHCP signal 210 and LHCP signal 212 concurrently. Thus, antenna 202 is configured to provide the vertical-component of RHCP signal 210 (e.g., $S_{1\angle 0°}$) and the vertical-component of LHCP signal 212 (e.g., $S_{2\angle 0°}$) to H-component/V-component generation block 203. Also, antenna 202 is configured to provide the horizontal-component of RHCP signal 210 (e.g., $S_{1\angle 90°}$) and the horizontal-component of LHCP signal 212 (e.g., $S_{2\angle -90°}$) to H-component/V-component generation block 203.

As illustrated in FIG. 2A, H-component/V-component generation block 203 includes first amplifier 206a, second amplifier 206b, intermediate summer 208a, intermediate subtractor 208b, V-signal summer 226a and H-signal subtractor 226b. In the present implementation, antenna 202 receives RHCP signal 210 and LHCP signal 212. In H-component/V-component generation block 203, each of first amplifier 206a and second amplifier 206b is directly coupled to antenna 202 without any intermediate components, such as phase shifters. Intermediate summer 208a is coupled to first amplifier 206a and second amplifier 206b, and provides first intermediate signal 222 to V-signal summer 226a and H-signal subtractor 226b. Intermediate subtractor 208b is coupled to first amplifier 206a and second amplifier 206b, and provides second intermediate signal 224 to V-signal summer 226a and H-signal subtractor 226b. V-signal summer 226a provides V-component output 228V based on a sum of first intermediate signal 222 and second intermediate signal 224. H-signal subtractor 226b provides H-component output 228H based on a difference between first intermediate signal 222 and second intermediate signal 224.

As shown in FIG. 2A, the vertical-component of RHCP signal 210 (e.g., $S_{1\angle 0°}$) and the vertical-component of LHCP signal 212 (e.g., $S_{2\angle 0°}$) are provided from antenna 202 directly to first amplifier 206a in H-component/V-component generation block 203. In the present implementation, first amplifier 206a may be a low noise amplifier, or a variable gain amplifier, having a gain of A1. Thus, first amplifier 206a amplifies the vertical-components of RHCP signal 210 and LHCP signal 212 (e.g., $S_{1\angle 0°}+S_{2\angle 0°}$) by gain A1, and provides first amplifier output 214, which can be expressed as, $A_1\times S_{1\angle 0°}+A_1\times S_{2\angle 0°}$, to intermediate summer 208a and intermediate subtractor 208b.

As further shown in FIG. 2A, the horizontal-component of RHCP signal 210 (e.g., $S_{1\angle 90°}$) and the horizontal-component of LHCP signal 212 (e.g., $S_{2\angle 90°}$) are provided from antenna 202 directly to second amplifier 206b in H-component/V-component generation block 203. In the present implementation, second amplifier 206b may be a low noise amplifier, or a variable gain amplifier, having a gain of A2. Thus, second amplifier 206b amplifies the horizontal-components of RHCP signal 210 and LHCP signal 212 (e.g., $S_{1\angle 90°}+S_{2\angle -90°}$) by gain A2, and provides second amplifier output 216, which can be expressed as, $A_2\times S_{1\angle 90°}+A_2\times S_{2\angle -90°}$, to intermediate summer 208a and intermediate subtractor 208b.

In the present implementation, intermediate summer 208a receives first amplifier output 214 from first amplifier 206a and second amplifier output 216 from second amplifier 206b, and combines first amplifier output 214 and second amplifier output 216 to provide first intermediate signal 222 (i.e., IS1). In the present implementation, first intermediate signal 222 can be expressed as $$IS1=A_1\times S_{1\angle 0°}+A_1\times S_{2\angle 0°}+A_2\times S_{1\angle 90°}+A_2\times S_{2\angle -90°} \quad \text{Equation (3)}.$$

In the present implementation, intermediate subtractor 208b receives first amplifier output 214 from first amplifier 206a and second amplifier output 216 from second amplifier 206b, and subtracts second amplifier output 216 from first amplifier output 214 to provide second intermediate signal 224 (i.e., IS2). In the present implementation, second intermediate signal 224 can be expressed as $$IS2=A_1\times S_{1\angle 0°}+A_1\times S_{2\angle 0°}-A_2\times S_{1\angle 90°}-A_2\times S_{2\angle -90°} \quad \text{Equation (4)}.$$

As further illustrated in FIG. 2A, in H-component/V-component generation block 203, first intermediate signal 222 and second intermediate signal 224 are provided to V-signal summer 226a and to H-signal subtractor 226b. In the present implementation, V-signal summer 226a receives first intermediate signal 222 from intermediate summer 208a and second intermediate signal 224 from intermediate subtractor 208b, and sums first intermediate signal 222 and second intermediate signal 224 to provide V-component output 228V (i.e., V202). In the present implementation, V-component output 228V can be expressed as $$V202=IS1+IS2$$
$$=A_1\times S_{1\angle 0°}+A_1\times S_{2\angle 0°}+A_2\times S_{1\angle 90°}+A_2\times S_{2\angle -90°}$$
$$+(A_1\times S_{1\angle 0°}+A_1\times S_{2\angle 0°}-A_2\times S_{1\angle 90°}-A_2\times S_{2\angle -90°})$$
$$=2\times(A_1\times S_{1\angle 0°}+A_1\times S_{2\angle 0°}) \quad \text{Equation (5)}.$$

As can be seen from Equation (5), only the amplified vertical-components of RHCP signal 210 and LHCP signal 212 (e.g., $A_1\times S_{1\angle 0°}+A_1\times S_{2\angle 0°}$) received from antenna 202 are present in V-component output 228V.

In addition, H-signal subtractor 226b receives first intermediate signal 222 from intermediate summer 208a and second intermediate signal 224 from intermediate subtractor 208b, and subtracts second intermediate signal 224 from first intermediate signal 222 to provide H-component output 228H (i.e., H202). In the present implementation, H-component output 228H can be expressed as $$V202=IS1-IS2$$
$$=A_1\times S_{1\angle 0°}+A_1\times S_{2\angle 0°}+A_2\times S_{1\angle 90°}+A_2\times S_{2\angle -90°}$$
$$(A_1\times S_{1\angle 0°}+A_1\times S_{2\angle 0°}-A_2\times S_{1\angle 90°}-A_2\times S_{2\angle -90°})$$
$$=2\times(A_2\times S_{1\angle 90°}+A_2\times S_{2\angle -90°}) \quad \text{Equation (6)}.$$

As can be seen from Equation (6), only the amplified horizontal-components of RHCP signal 210 and LHCP signal 212 (e.g., $A_2\times S_{1\angle 90°}+A_2\times S_{2\angle -90°}$) received from antenna 202 are present in H-component output 228H.

As can be seen in FIG. 2A, H-component/V-component generation block 203 is configured to provide V-component output 228V and H-component output 228H based on RHCP signal 210 and LHCP signal 212 with dual circular polarization received from antenna 202 without using any phase shifters, such as 90-degree phase shifters, which are normally required in conventional circuits performing similar functions. Phase shifters are typically bulky components that can undesirably occupy valuable space in the wireless receiver. As shown in FIG. 1, wireless receiver 100 may include thousands of antennas on phased array antenna panel 101. By reducing the number of phase shifters associated with each antenna, the present implementation can substantially reduce the overall size as well as the manufacturing cost of the wireless receiver. Additionally, the present implementation can also reduce insertion loss and improve linearity of the wireless receiver.

In one implementation, V-component output 228V and H-component output 228H can be utilized to recover RHCP signal 210 and LHCP signal 212 or their phase shifted versions of RHCP signal 210 and LHCP signal 212, for example, using known techniques. In one implementation, V-component output 228V and H-component output 228H can be subsequently provided to an RF front end circuit, having low noise amplifiers, phase shifters, and variable gain amplifiers, for further processing.

Figure 2B:
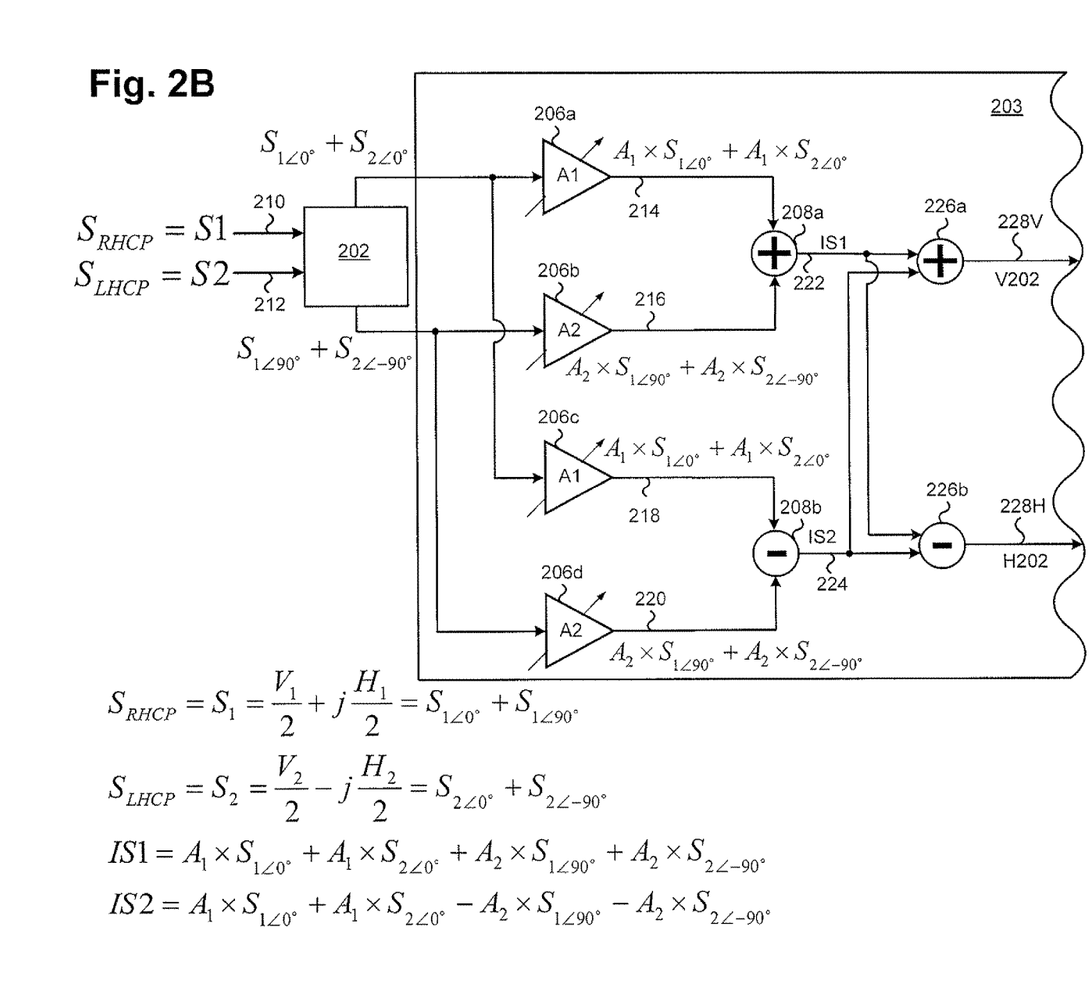
FIG. 2B illustrates a functional circuit diagram of a portion of an exemplary wireless receiver according to one implementation of the present application.

Referring to FIG. 2B, FIG. 2B illustrates a functional circuit diagram of a portion of an exemplary wireless receiver according to one implementation of the present application. As illustrated in FIG. 2B, antenna 202 is coupled to H-component/V-component generation block 203. In one implementation, antenna 202 in FIG. 2B may correspond to any of the antennas, such as antennas 102a, 102b, 102c and 102d, in wireless receiver 100 in FIG. 1. In one implementation, H-component/V-component generation block 203 may be part of an RF front end chip, such as RF front end chip 104a in FIG. 1. In another implementation, H-component/V-component generation block 203 may be part of a master chip, such as master chip 180 in FIG. 1. In yet another implementation, H-component/V-component generation block 203 may be integrated in any appropriate portion of the active circuits in a wireless receiver, such as wireless receiver 100 in FIG. 1.

In one implementation, antenna 202 may be configured to receive signals from one or more wireless transmitters, such as commercial geostationary communication satellites or low earth orbit satellites having a very large bandwidth in the 10 GHz to 20 GHz frequency range and a very high data rate. In another implementation, antenna 202 may be configured to receive signals in the 60 GHz frequency range, sometimes referred to as "60 GHz communications," which involve transmission and reception of millimeter wave signals.

As illustrated in FIG. 2B, antenna 202 is configured to receive wireless signals, such as right-handed circularly polarized (RHCP) signal 210 (i.e., S1) and left-handed circularly polarized (LHCP) signal 212 (i.e., S2) concurrently, for example. In one implementation, antenna 202 may be a patch antenna, or alternatively a cavity antenna, having a vertical-polarization probe and a horizontal-polarization probe (not explicitly shown in FIG. 2B) extended over the cavity. However, the present application is not limited to a certain type of antenna, and various antenna designs, shapes, or configurations can be used.

Circularly polarized signals received by antenna 202 can each be separated into a horizontal (H) component and a vertical (V) component. For example, RHCP signal 210 can be expressed as, $$S_{RHCP} = S_1 = \frac{V_1}{2} + j\frac{H_1}{2} = S_{1\angle 0°} + S_{1\angle 90°}. \quad \text{Equation (7)}$$

Similarly, LHCP signal 212 can be expressed as, $$S_{LHCP} = S_2 = \frac{V_2}{2} - j\frac{H_2}{2} = S_{2\angle 0°} + S_{2\angle -90°}. \quad \text{Equation (8)}$$

In the present implementation, antenna 202 receives RHCP signal 210 and LHCP signal 212 concurrently. Thus, antenna 202 is configured to provide the vertical-component of RHCP signal 210 (e.g., $S_{1\angle 0°}$) and the vertical-component of LHCP signal 212 (e.g., $S_{2\angle 0°}$) to H-component/V-component generation block 203. Also, antenna 202 is configured to provide the horizontal-component of RHCP signal 210 (e.g., $S_{1\angle 90°}$) and the horizontal-component of LHCP signal 212 (e.g., $S_{2\angle -90°}$) to H-component/V-component generation block 203.

As illustrated in FIG. 2B, H-component/V-component generation block 203 includes first amplifier 206a, second amplifier 206b, third amplifier 206c, fourth amplifier 206d, intermediate summer 208a, intermediate subtractor 208b, V-signal summer 226a and H-signal subtractor 226b. Antenna 202 receiving RHCP signal 210 and LHCP signal 212. First amplifier 206a and second amplifier 206b are directly coupled to antenna 202 without any intermediate components, such as phase shifters. Intermediate summer 208a is coupled to first amplifier 206a and second amplifier 206b, and provides first intermediate signal 222 to V-signal summer 226a and H-signal subtractor 226b. Third amplifier 206c and fourth amplifier 206d are also directly coupled to antenna 202 without any intermediate components, such as phase shifters.

Intermediate subtractor 208b is coupled to third amplifier 206c and fourth amplifier 206d, and provides second intermediate signal 224 to V-signal summer 226a and H-signal subtractor 226b. V-signal summer 226a provides V-component output 228V based on a sum of first intermediate signal 222 and second intermediate signal 224. H-signal subtractor 226b provides H-component output 228H based on a difference between first intermediate signal 222 and second intermediate signal 224.

As shown in FIG. 2B, the vertical-component of RHCP signal 210 (e.g., $S_{1\angle 0°}$) and the vertical-component of LHCP signal 212 (e.g., $S_{2\angle 0°}$) are provided from antenna 202 directly to first amplifier 206a of H-component/V-component generation block 203. In the present implementation, first amplifier 206a may be a low noise amplifier, or a variable gain amplifier, having a gain of A1. Thus, first amplifier 206a amplifies the vertical-components of RHCP signal 210 and LHCP signal 212 (e.g., $S_{1\angle 0°}+S_{2\angle 0°}$) by gain A1. As such, first amplifier 206a provides first amplifier output 214, which can be expressed as, $A_1 \times S_{1\angle 0°}+A_1 \times S_{2\angle 0°}$, to intermediate summer 208a.

As further shown in FIG. 2B, the horizontal-component of RHCP signal 210 (e.g., $S_{1\angle 90°}$) and the horizontal-component of LHCP signal 212 (e.g., $S_{2\angle -90°}$) are provided from antenna 202 directly to second amplifier 206b in H-component/V-component generation block 203. In the present implementation, second amplifier 206b may be a low noise amplifier, or a variable gain amplifier, having a gain of A2. Thus, second amplifier 206b amplifies the horizontal-components of RHCP signal 210 and LHCP signal 212 (e.g., $S_{1\angle 90°}+S_{2\angle -90°}$) by gain A2. As such, second amplifier 206b provides second amplifier output 216, which can be expressed as, $A_2 \times S_{1\angle 90°}+A_2 \times S_{2\angle -90°}$, to intermediate summer 208a.

In the present implementation, intermediate summer 208a receives first amplifier output 214 from first amplifier 206a and second amplifier output 216 from second amplifier 206b, and sums first amplifier output 214 and second amplifier output 216 to provide first intermediate signal 222 (i.e., IS1). In the present implementation, first intermediate signal 222 can be expressed as $$IS1 = A_1 \times S_{1\angle 0°}+A_1 \times S_{2\angle 0°}+A_2 \times S_{1\angle 90°}+A_2 \times S_{2\angle -90°} \quad \text{Equation (9)}.$$

As shown in FIG. 2B, the vertical-component of RHCP signal 210 (e.g., $S_{1\angle 0°}$) and the vertical-component of LHCP signal 212 (e.g., $S_{2\angle 0°}$) are also provided from antenna 202 directly to third amplifier 206c in H-component/V-component generation block 203. In the present implementation, third amplifier 206c may be a low noise amplifier, or a variable gain amplifier, having a gain of A1. Thus, third amplifier 206c amplifies the vertical-components of RHCP signal 210 and LHCP signal 212 (e.g., $S_{1\angle 0°}+S_{2\angle 0°}$) by gain A1. As such, third amplifier 206c provides third amplifier output 218, which can be expressed as, $A_1 \times S_{1\angle 0°}+A_1 \times S_{2\angle 0°}$, to intermediate subtractor 208b.

As further shown in FIG. 2B, the horizontal-component of RHCP signal 210 (e.g., $S_{1\angle 90°}$) and the horizontal-component of LHCP signal 212 (e.g., $S_{2\angle -90°}$) are provided from antenna 202 directly to fourth amplifier 206d of H-component/V-component generation block 203. In the present implementation, fourth amplifier 206d may be a low noise amplifier, or a variable gain amplifier, having a gain of A2. Thus, fourth amplifier 206d amplifies the horizontal-components of RHCP signal 210 and LHCP signal 212 (e.g., $S_{1\angle 90°}+S_{2\angle -90°}$) by gain A2. As such, fourth amplifier 206d provides fourth amplifier output 220, which can be expressed as, $A_2 \times S_{1\angle 90°} + A_2 \times S_{2\angle -90°}$, to intermediate subtractor 208b.

In the present implementation, intermediate subtractor 208b receives third amplifier output 218 from third amplifier 206c and fourth amplifier output 220 from fourth amplifier 206d, and subtracts fourth amplifier output 220 from third amplifier output 218 to provide second intermediate signal 224 (i.e., IS2). In the present implementation, second intermediate signal 224 can be expressed as $$IS2 = A_1 \times S_{1\angle 0°} + A_1 \times S_{2\angle 0°} - A_2 \times S_{1\angle 90°} - A_2 \times S_{2\angle -90°} \quad \text{Equation (10)}.$$

As further illustrated in FIG. 2B, in H-component/V-component generation block 203, first intermediate signal 222 and second intermediate signal 224 are provided to V-signal summer 226a and to H-signal subtractor 226b. In the present implementation, V-signal summer 226a receives first intermediate signal 222 from intermediate summer 208a and second intermediate signal 224 from intermediate subtractor 208b, and sums first intermediate signal 222 and second intermediate signal 224 to provide V-component output 228V (i.e., V202). In the present implementation, V-component output 228V can be expressed as $$V202 = IS1 + IS2$$
$$= A_1 \times S_{1\angle 0°} + A_1 \times S_{2\angle 0°} + A_2 \times S_{1\angle 90°} + A_2 \times S_{2\angle -90°}$$
$$+ (A_1 \times S_{1\angle 0°} + A_1 \times S_{1\angle 90°} - A_2 \times S_{1\angle 90°} - A_2 \times S_{2\angle -90°})$$
$$= 2 \times (A_1 \times S_{1\angle 0°} + A_1 \times S_{2\angle 0°}) \quad \text{Equation (11)}.$$

Similar to V-component output 228V in FIG. 2A, in FIG. 2B, only the amplified vertical-components of RHCP signal 210 and LHCP signal 212 (e.g., $A_1 \times S_{1\angle 0°} + A_1 \times S_{2\angle 0°}$) received from antenna 202 are present in V-component output 228V.

In addition, H-signal subtractor 226b receives first intermediate signal 222 from intermediate summer 208a and second intermediate signal 224 from intermediate subtractor 208b, and subtracts second intermediate signal 224 from first intermediate signal 222 to provide H-component output 228H (i.e., H202). In the present implementation, H-component output 228H can be expressed as $$V202 = IS1 - IS2$$
$$= A_1 \times S_{1\angle 0°} + A_1 \times S_{2\angle 0°} + A_2 \times S_{1\angle 90°} + A_2 \times S_{2\angle -90°}$$
$$- (A_1 \times S_{1\angle 0°} + A_1 \times S_{2\angle 0°} - A_2 \times S_{1\angle 90°} - A_2 \times S_{2\angle -90°})$$
$$= 2 \times (A_2 \times S_{1\angle 90°} + A_2 \times S_{2\angle -90°}) \quad \text{Equation (12)}.$$

Similar to H-component output 228H in FIG. 2A, in FIG. 2B, only the amplified horizontal-components of RHCP signal 210 and LHCP signal 212 (e.g., $A_2 \times S_{1\angle 90°} + A_2 \times S_{2\angle -90°}$) received from antenna 202 are present in H-component output 228H.

As can be seen in FIG. 2B, H-component/V-component generation block 203 is configured to provide V-component output 228V and H-component output 228H based on RHCP signal 210 and LHCP signal 212 with dual circular polarization received from antenna 202 without using any phase shifters, such as 90-degree phase shifters, which are normally required in conventional circuits performing similar functions. Phase shifters are typically bulky components that can undesirably occupy valuable space in the wireless receiver. By eliminating the use of phase shifters, the present implementation can reduce the overall size as well as the manufacturing cost of a wireless receiver. Additionally, the present implementation can also reduce insertion loss and improve linearity of the wireless receiver.

In one implementation, V-component output 228V and H-component output 228H can be utilized to recover RHCP signal 210 and LHCP signal 212 or their phase shifted versions of RHCP signal 210 and LHCP signal 212, for example, using known techniques. In one implementation, V-component output 228V and H-component output 228H can be subsequently provided to an RF front end circuit, having low noise amplifiers, phase shifters, and variable gain amplifiers, for further processing.

Figure 3:
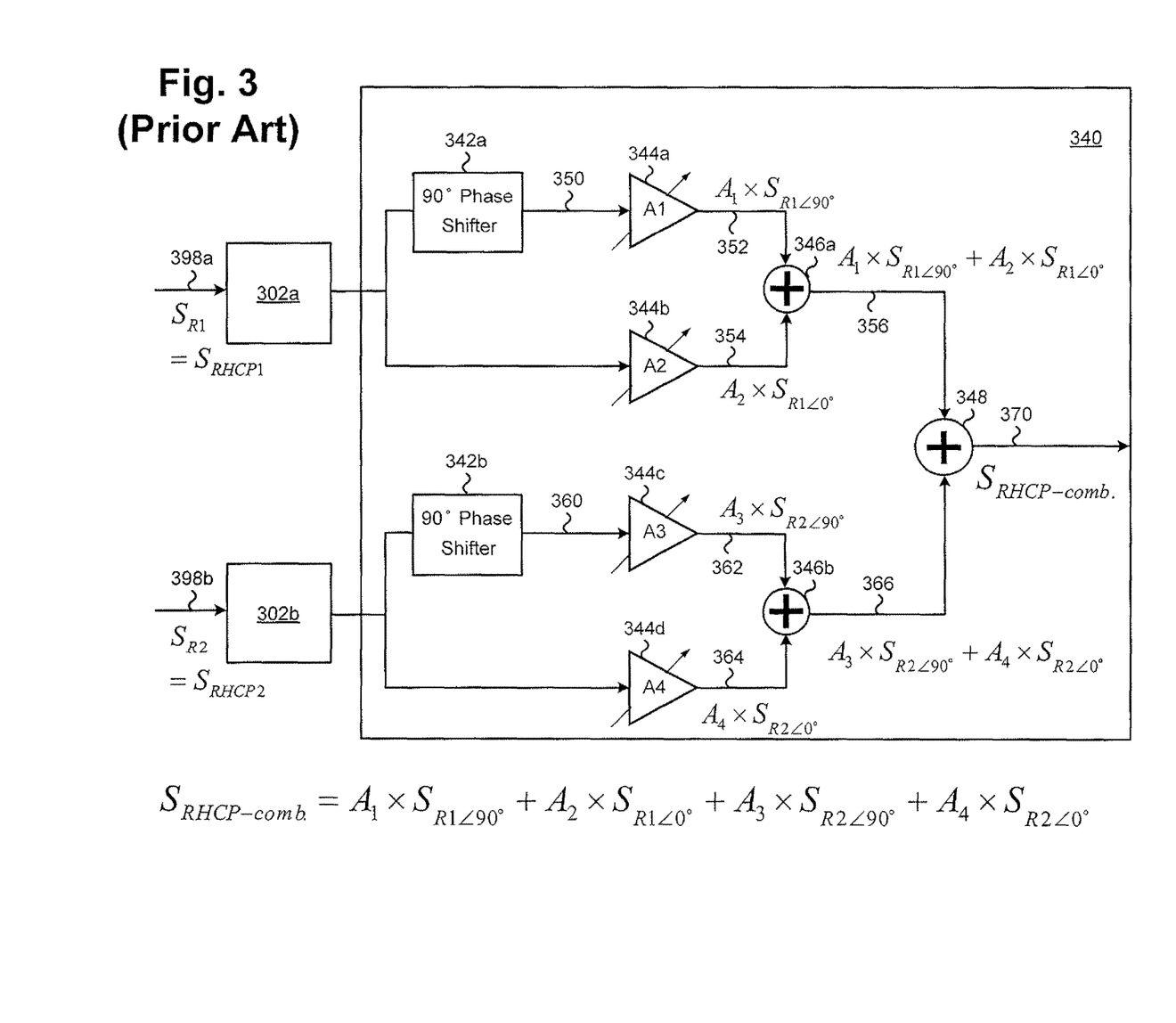
FIG. 3 illustrates a functional circuit diagram of a portion of a conventional wireless receiver.

FIG. 3 illustrates a functional circuit diagram of a portion of a conventional wireless receiver. As illustrated in FIG. 3, antennas 302a and 302b are coupled to circularly polarized-combined signal generation block 340. As illustrated in FIG. 3, antenna 302a is configured to receive right-handed circularly polarized (RHCP) signal 398a (i.e., $S_{RHCP1} = S_{R1}$), while antenna 302b is configured to receive right-handed circularly polarized (RHCP) signal 398b (i.e., $S_{RHCP2} = S_{R2}$). It is noted that in this implementation, antennas 302a and 302b are receiving circularly-polarized signals with only a single polarization, as opposed to circularly-polarized signals with dual-polarization.

As shown in FIG. 3, RHCP signal 398a received by antenna 302a is provided to circularly polarized-combined signal generation block 340. For example, RHCP signal 398a is provided to 90-degree phase shifter 342a coupled to first amplifier 344a. In the present implementation, 90-degree phase shifter 342a provides phase shifted output 350 to first amplifier 344a, which amplifies phase shifted output 350 by gain A1. First amplifier 344a provides first amplifier output 352 (e.g., $A_1 \times S_{R1\angle 90°}$) to summer 346a. RHCP signal 398a is also provided to second amplifier 344b, which amplifies RHCP signal 398a by gain A2. Second amplifier 344b provides second amplifier output 354 (e.g., $A_2 \times S_{R1\angle 0°}$) to first summer 346a. First summer 346a combines first amplifier output 352 and second amplifier output 354, and provides first summer signal 356 (e.g., $A_1 - S_{R1\angle 90°} + A_2 \times S_{R1\angle 0°}$) to output summer 348.

As shown in FIG. 3, RHCP signal 398b received by antenna 302b is provided to circularly polarized-combined signal generation block 340. For example, RHCP signal 398b is provided to 90-degree phase shifter 342b coupled to third amplifier 344c. In the present implementation, 90-degree phase shifter 342b provides phase shifted output 360 to third amplifier 344c, which amplifies phase shifted output 360 by gain A3. Third amplifier 344c provides third amplifier output 352 (e.g., $A_3 \times S_{R2\angle 90°}$) to second summer 346b. RHCP signal 398b is also provided to fourth amplifier 344d, which amplifies RHCP signal 398b by gain A4. Fourth amplifier 344d provides fourth amplifier output 364 (e.g., $A_4 \times S_{R2\angle 90°}$) to second summer 346b. Second summer 346b combines third amplifier output 362 and fourth amplifier output 364, and provides second summer signal 366 (e.g., $A_3 \times S_{R2\angle 90°} + A_4 \times S_{R2\angle 0°}$) to output summer 348.

As illustrated in FIG. 3, output summer 348 combines first summer signal 356 from first summer 346a and second summer signal 366 from second summer 346b, and provides circularly polarized-combined signal 370 (i.e., $S_{RHCP\text{-}comb.}$), which can be expressed as $$S_{RHCP\text{-}comb.} = A_1 \times S_{R1\angle 90°} + A_2 S_{R1\angle 90°} + A_3 \times S_{R2\angle 90°} + A_4 \times S_{R2\angle 0°} \quad \text{Equation (13)}.$$

As can be seen in FIG. 3, circularly polarized-combined signal generation block 340 is configured to provide circularly polarized-combined signal 370 based on RHCP signal 398a and RHCP signal 398b by using at least two 90-degree phase shifters, namely 90-degree phase shifters 342a and 342b. As discussed above, since phase shifters are bulky, it is desirable to reduce or substantially eliminate the number of phase shifters while maintaining substantially the same functionality of the wireless receiver.

Figure 4:
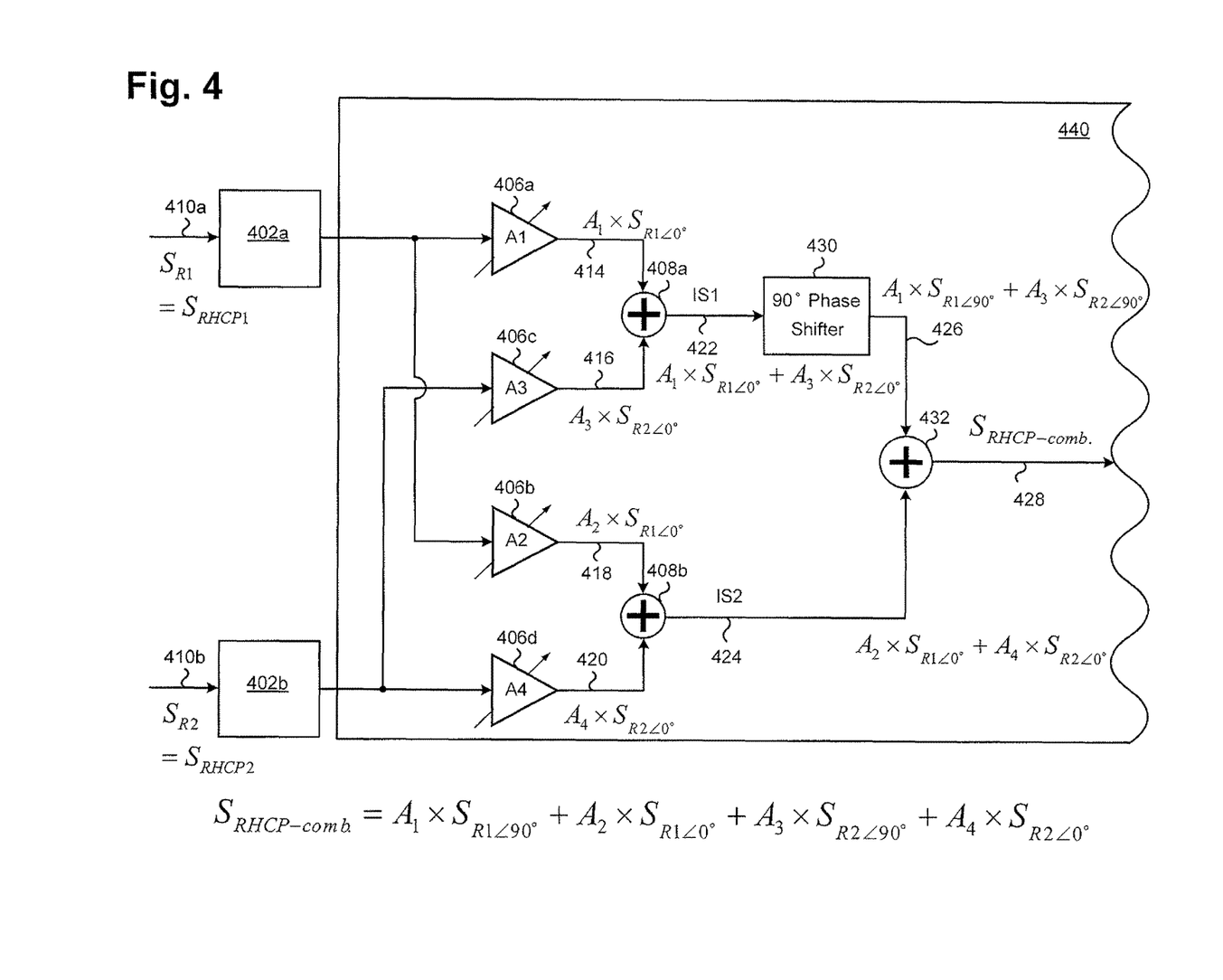
FIG. 4 illustrates a functional circuit diagram of a portion of an exemplary wireless receiver according to one implementation of the present application.

FIG. 4 illustrates a functional circuit diagram of a portion of an exemplary wireless receiver according to one implementation of the present application. As illustrated in FIG. 4, antennas 402a and 402b are coupled to circularly polarized-combined signal generation block 440. In one implementation, antennas 402a and 402b in FIG. 4 may correspond to antennas 102a and 102b in wireless receiver 100 in FIG. 1. In one implementation, circularly polarized-combined signal generation block 440 may be part of an RF front end chip, such as RF front end chip 104a in FIG. 1. In another implementation, circularly polarized-combined signal generation block 440 may be part of a master chip, such as master chip 180 in FIG. 1. In yet another implementation, circularly polarized-combined signal generation block 440 may be integrated in any appropriate portion of the active circuits in a wireless receiver, such as wireless receiver 100 in FIG. 1.

In one implementation, antennas 402a and 402b may be configured to receive signals from one or more wireless transmitters, such as commercial geostationary communication satellites or low earth orbit satellites having a very large bandwidth in the 10 GHz to 20 GHz frequency range and a very high data rate. In another implementation, antennas 402a and 402b may be configured to receive signals in the 60 GHz frequency range, sometimes referred to as "60 GHz communications," which involve transmission and reception of millimeter wave signals.

As illustrated in FIG. 4, circularly polarized-combined signal generation block 440 includes first amplifier 406a, second amplifier 406b, third amplifier 406c, fourth amplifier 406d, first intermediate summer 408a, second intermediate summer 408b, phase shifter 430, and output summer 432. Antenna 402a receives first right-handed circularly polarized (RHCP) signal 410a, and is directly coupled to each of first amplifier 406a and second amplifier 406b, without any intermediate components, such as phase shifters. Antenna 402b receives second right-handed circularly polarized (RHCP) signal 410b, and is directly coupled to each of third amplifier 406c and fourth amplifier 406d, without any intermediate components, such as phase shifters. First intermediate summer 408a is coupled to first amplifier 406a and third amplifier 406c, and provides first intermediate signal 422. Second intermediate summer 408b is coupled to second amplifier 406b, and fourth amplifier 406d, and provides second intermediate signal 424. Phase shifter 430 is coupled to first intermediate signal 422, and provides intermediate phase shifted signal 426 to output summer 432. Output summer 432 combines or sums intermediate phase shifted signal 426 and second intermediate signal 424 to provide circularly polarized-combined signal 428.

As illustrated in FIG. 4, antenna 402a is configured to receive first right-handed circularly polarized (RHCP) signal 410a (i.e., $S_{RHCP1}=S_{R1}$), while antenna 402b is configured to receive second right-handed circularly polarized (RHCP) signal 410b (i.e., $S_{RHCP2}=S_{R2}$). In one implementation, antennas 402a and 402b may be patch antennas, or alternatively cavity antennas, having a vertical-polarization probe and a horizontal-polarization probe (not explicitly shown in FIG. 4) extended over the cavity. However, the present application is not limited to a certain type of antenna, and various antenna designs, shapes, or configurations can be used. As shown in FIG. 4, antenna 402a provides first RHCP signal 410a to circularly polarized-combined signal generation block 440. For example, first RHCP signal 410a is provided directly to first amplifier 406a, which amplifies first RHCP signal 410a by gain A1. First amplifier 406a provides first amplifier output 414 (e.g., $A_1 \times S_{R1 \angle 0°}$) to first intermediate summer 408a. First RHCP signal 410a is also provided directly to second amplifier 406b, which amplifies first RHCP signal 410a by gain A2. Second amplifier 406b provides second amplifier output 418 (e.g., $A_2 \times S_{R1 \angle 0°}$) to second intermediate summer 408b.

As illustrated in FIG. 4, antenna 402b provides second RHCP signal 410b to circularly polarized-combined signal generation block 440. For example, second RHCP signal 410b is provided directly to third amplifier 406c, which amplifies second RHCP signal 410b by gain A3. Third amplifier 406c provides third amplifier output 416 (e.g., $A_3 \times S_{R2 \angle 0°}$) to first intermediate summer 408a. Second RHCP signal 410b is also provided directly to fourth amplifier 406d, which amplifies second RHCP signal 410b by gain A4. Fourth amplifier 406d provides fourth amplifier output 420 (e.g., $A_4 \times S_{R2 \angle 0°}$) to second intermediate summer 408b. In the present implementation, first amplifier 406a, second amplifier 406b, third amplifier 406c and fourth amplifier 406d may each be a low noise amplifier, or a variable gain amplifier, and have respective gains of A1, A2, A3 and A4.

As illustrated in FIG. 4, first intermediate summer 408a receives first amplifier output 414 from first amplifier 406a and third amplifier output 416 from third amplifier 406c, and sums first amplifier output 414 and third amplifier output 416 to provide first intermediate signal 422 (i.e., IS1). In the present implementation, first intermediate signal 422 can be expressed as $$IS1 = A_1 \times S_{R1 \angle 0°} + A_3 \times S_{R2 \angle 0°} \qquad \text{Equation (14)}.$$

Also, second intermediate summer 408b receives second amplifier output 418 from second amplifier 406b and fourth amplifier output 420 from fourth amplifier 406d, and sums second amplifier output 418 and fourth amplifier output 420 to provide second intermediate signal 424 (i.e., IS2). In the present implementation, second intermediate signal 424 can be expressed as $$IS2 = A_2 \times S_{R1 \angle 0°} + A_4 \times S_{R2 \angle 0°} \qquad \text{Equation (15)}.$$

As illustrated in FIG. 4, first intermediate summer 408a provides first intermediate signal 422 to 90-degree phase shifter 430, where 90-degree phase shifter 430 provides intermediate phase shifted signal 426 to output summer 432. In the present implementation, intermediate phase shifted signal 426 can be expressed as, $A_1 \times S_{R1 \angle 90°} + A_3 \times S_{R2 \angle 90°}$. Second intermediate summer 408b provides second intermediate signal 424 to output summer 432. As can be seen in FIG. 4, output summer 432 receives intermediate phase shifted signal 426 from 90-degree phase shifter 430 and second intermediate signal 424 from second intermediate summer 408b, and provides circularly polarized-combined signal 428 (i.e., $S_{RHCP\text{-}comb}$), which can be expressed as $$S_{RHCP\text{-}comb} = A_1 \times S_{R1 \angle 90°} + A_2 \times S_{R1 \angle 0°} + A_3 \times S_{R2 \angle 90°} + A_4 \times S_{R2 \angle 0°} \qquad \text{Equation (16)}.$$

As can be seen in FIG. 4, circularly polarized-combined signal generation block 440 is configured to provide circularly polarized-combined signal 428 based on first RHCP signal 410a and second RHCP signal 410b by utilizing only a single 90-degree phase shifter, namely 90-degree phase shifter 430. As shown in FIG. 1, wireless receiver 100 may includes thousands of antennas on phased array antenna panel 101. By reducing the number of phase shifters associated with each antenna, the present implementation can substantially reduce the overall size as well as the manufacturing cost of the wireless receiver. Additionally, the present implementation can also reduce insertion loss and improve linearity of the wireless receiver.

From the above description, it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A wireless receiver comprising:
   an antenna receiving a right-handed circularly polarized (RHCP) signal and a left-handed circularly polarized (LHCP) signal;
   a first amplifier and a second amplifier coupled to said antenna;
   an intermediate summer coupled to said first and second amplifiers, and providing a first intermediate signal;
   an intermediate subtractor coupled to said first and second amplifiers, and providing a second intermediate signal;
   wherein said wireless receiver generates a V-component output and an H-component output based on said first intermediate signal and said second intermediate signal.

2. The wireless receiver of claim 1 wherein said wireless receiver is configured to provide said V-component output and said H-component output without using a phase shifter.

3. The wireless receiver of claim 1 wherein said first amplifier is a variable gain amplifier with a first gain.

4. The wireless receiver of claim 1 wherein said antenna is directly coupled to said first amplifier without using a phase shifter.

5. The wireless receiver of claim 1 wherein said second amplifier is a variable gain amplifier with a second gain.

6. The wireless receiver of claim 1 wherein said antenna is directly coupled to said second amplifier without using a phase shifter.

7. The wireless receiver of claim 1 wherein said wireless receiver generates said V-component output and said H-component output without using a 90-degree phase shifter.

8. A wireless receiver comprising:
   an antenna receiving a right-handed circularly polarized (RHCP) signal and a left-handed circularly polarized (LHCP) signal;
   a first amplifier and a second amplifier coupled to said antenna;
   an intermediate summer coupled to said first and second amplifiers, and providing a first intermediate signal;
   a third amplifier and a fourth amplifier coupled to said antenna;
   an intermediate subtractor coupled to said third and fourth amplifiers, and providing a second intermediate signal;
   wherein said wireless receiver generates a V-component output and an H-component output based on said first intermediate signal and said second intermediate signal.

9. The wireless receiver of claim 8 wherein said wireless receiver is configured to provide said V-component output and said H-component output without using a phase shifter.

10. The wireless receiver of claim 8 wherein said first amplifier and said third amplifier are variable gain amplifiers with a first gain.

11. The wireless receiver of claim 8 wherein said second amplifier and said fourth amplifier are variable gain amplifiers with a second gain.

12. The wireless receiver of claim 8 wherein said antenna is directly coupled to each of said first, second, third and fourth amplifiers without using a phase shifter.

13. The wireless receiver of claim 8 wherein said wireless receiver is configured to provide said V-component output and said H-component output without using a 90-degree phase shifter.

14. A wireless receiver comprising:
   an antenna receiving a right-handed circularly polarized (RHCP) signal and a left-handed circularly polarized (LHCP) signal;
   a first amplifier and a second amplifier coupled to said antenna;
   a first intermediate signal produced based on outputs of said first and second amplifiers;
   a second intermediate signal produced based on said outputs of said first and second amplifiers;
   wherein said wireless receiver generates a V-component output and an H-component output based on said first intermediate signal and said second intermediate signal.

15. The wireless receiver of claim 14 wherein said wireless receiver is configured to provide said V-component output and said H-component output without using a phase shifter.

16. The wireless receiver of claim 14 wherein said first amplifier is a variable gain amplifier with a first gain.

17. The wireless receiver of claim 14 wherein said antenna is directly coupled to said first amplifier without using a phase shifter.

18. The wireless receiver of claim 14 wherein said second amplifier is a variable gain amplifier with a second gain.

19. The wireless receiver of claim 14 wherein said antenna is directly coupled to said second amplifier without using a phase shifter.

20. The wireless receiver of claim 14 wherein said wireless receiver is configured to provide said V-component output and said H-component output without using a 90-degree phase shifter.

* * * * *